United States Patent [19]

Tickle

[11] 4,377,857

[45] Mar. 22, 1983

[54] ELECTRICALLY ERASABLE PROGRAMMABLE READ-ONLY MEMORY

[75] Inventor: Andrew C. Tickle, Los Altos, Calif.

[73] Assignee: Fairchild Camera & Instrument, Mountain View, Calif.

[21] Appl. No.: 207,859

[22] Filed: Nov. 18, 1980

[51] Int. Cl.³ .............................................. G11C 11/40
[52] U.S. Cl. ..................................... 365/185; 365/182
[58] Field of Search ................ 365/185, 189, 174, 182

[56] References Cited

U.S. PATENT DOCUMENTS 3,508,211 4/1970 Wegener ............................. 365/189
3,996,657 12/1976 Simko et al. ........................ 365/189

Primary Examiner—Terrell W. Fears
Attorney, Agent, or Firm—Kenneth Olsen; Michael J. Pollock; Theodore Scott Park

[57] ABSTRACT

An electrically erasable programmable read-only memory (E²PROM) is provided which utilizes an inhibit voltage applied to unselected word lines during writing to prevent writing in unselected rows. In the preferred embodiment, each memory cell of the E²PROM array consists of a single floating gate field effect transistor. The E²PROM of the present invention provides for row erasure and single bit writing.

34 Claims, 9 Drawing Figures

ELECTRICALLY ERASABLE PROGRAMMABLE READ-ONLY MEMORY

BACKGROUND OF THE INVENTION

1. Field of the Invention

The present invention relates to an electrically erasable programmable read-only memory ($E^2PROM$) and, particularly, to an $E^2PROM$ array which utilizes an inhibit voltage applied to unselected word lines during writing to prevent writing in unselected rows.

2. Description of the Prior Art

A basic semiconductor memory array consists of a matrix of rows and columns of electrical conducting paths formed on a semiconductor chip. The conducting paths of the matrix do not physically intersect but rather are interconnected at the cross-over points by memory cells. Each memory cell stores a bit of binary data, i.e., either a "0" or a "1". Whether a "0" or a "1" is stored is based upon whether or not the cell conducts. Binary data stored in the memory array is read from an individual memory cell by applying a voltage to the conducting row containing the selected cell and monitoring the conducting column of that cell to determine whether it is drawing current.

In one type of memory array, the conducting paths are interconnected by memory cells which are permanently altered during fabrication to be either conducting or nonconducting. That is, the binary data to be stored in each cell is inalterably encoded during the fabrication process. For this reason, such an array is known as a read-only memory (ROM). Since alteration of the memory content of a ROM requires expensive redesign, it is impractical to incorporate ROMs into equipment having short production runs. To compensate for this inherent deficiency, a programmable read-only memory (PROM) was developed.

A typical PROM consists of a matrix of conducting paths similar to that of a ROM. Rather than utilizing the permanently altered memory cells which are definitive of a ROM for interconnecting the cross-over points of the matrix, a PROM interconnects the cross-over points by memory cells which include an alterable element such as a fuse. Thus, each cell may be selectively programmed. PROMs are usually shipped to the end user in an unencoded state. Each bit of binary data comprising the memory information to be stored in the array is then programmed into the array by altering the appropriate memory cells. This selectively programmable feature allows a standard PROM design to function as a memory array in a variety of applications. PROMs, however, are limited in that once the memory cells of a PROM have been programmed, they, like the cells of a ROM, cannot be altered. The solution to this limitation is provided by the erasable PROM (E-PROM).

Conventional E-PROMs maintain the general matrix structure of the ROM and PROM. The interconnecting memory cells of an E-PROM are floating gate field effect transistors. In floating gate field effect transistors, the voltage of the transistor's control gate is capacitively coupled in series with the floating gate rather than directly to the underlying channel as is the case in conventional field effect transistors. Because of this capacitive coupling, the presence of charge on the floating gate alters the threshold voltage of the transistor as seen by the control gate. This feature allows binary data to be stored in the transistor as the presence or absence of charge on the floating gate.

An E-PROM memory cell with its floating gate uncharged conducts at a normal threshold voltage, representing one binary state. The binary state of the cell may be changed by injecting charge into the floating gate. As stated above, the charge on the floating gate raises the normal threshold voltage of the transistor. Thus, the memory cell will not conduct unless the control gate voltage is sufficient to overcome the charge on the floating gate. Therefore, the binary state of the cell may be read by applying a voltage to the control gate of the cell which is between the normal threshold voltage of an uncharged cell and the increased threshold voltage of a charged cell. The cell is then monitored to determine whether it is conducting or non-conducting.

In a conventional floating gate memory cell, the floating gate is charged by energizing the electrons in the channel of the underlying field effect transistor. When the electrons gain sufficient energy, they overcome the energy barrier between the substrate of the cell and the oxide insulator which surrounds the floating gate and penetrate the oxide. Once the electrons penetrate the oxide, they are attracted to the floating gate which is capacitively coupled with a positive potential applied to the control gate.

The advantage of an E-PROM is that the charged cells of an E-PROM array may be erased by removing stored electrons from the floating gate. This is done by exposing the entire array to ultraviolet light through an overlying quartz window. Photons are absorbed by the electrons held by the floating gate of each charged cell in the array. The cell discharges as the electrons become energized, leave the floating gate through the surrounding oxide insulator and are drawn either to the control gate or to the substrate.

The disadvantage of UV erasable E-PROMs is that erasure is nonselective. Because the entire E-PROM structure is exposed to ultraviolet light, complete erasure of all of the memory cells in the matrix is required before the array can be reprogrammed. Thus, while UV-erasable E-PROMs are adequate for off-board reprogramming, they do not fill the need in applications which require numerous alterations of the stored data without removing the memory from its system environment.

More recently, electrically erasable PROMs ($E^2$-PROM) have been developed. $E^2$PROMS provide for selective erasure and, thus, for in-circuit programming. In addition, $E^2$PROMs are inherently more convenient and less costly to use since they require no external ultraviolet light source for erasure. $E^2$PROMs also offer the further advantages of low power consumption and low current requirements for both erasure and programming.

A conventional floating gate $E^2PROM$ memory cell is divided into two regions. A first select region provides access to the second region of the cell. The second region provides binary data storage. The storage region is a floating gate field effect transistor. The storage region cannot be accessed for programming, reading or erasure unless the select region of the same cell is activated.

Charge is transferred to and from the floating gate of the storage region by the mechanism of tunneling. Tunneling is the movement of electrons through a thin portion of normally thick insulator material, typically silicon oxide, which separates the floating gate from the substrate of the transistor. Normal insulator thickness is about 500 Angstroms. The thin oxide utilized for tunneling is usually 200 Angstroms or less thick.

In one type of E²PROM floating gate memory cell, the select region and the storage region of the cell are distinctly formed in adjacent oxide-isolated portions of a semiconductor chip. The select region is a conventional field effect transistor. The storage region is a floating gate field effect transistor. The floating gate of the storage transistor is insulated from the underlying substrate by the normal gate oxide and by a thin length of oxide which is about 200 Angstroms or less thick. The thin oxide is formed over the N-doped drain region of the storage transistor. The control gate of the storage transistor is polysilicon.

The above-described memory cell may be utilized in an E²PROM array which provides for individual byte alteration. According to the byte-alterable design, rows of eight-cell bytes are arranged side-by-side in a plurality of vertical groups. The control gates of the eight storage transistors of the memory cells of a selected byte are connected to a horizontal storage transistor conducting path which is unique to that byte. All of the storage transistor conducting paths of a vertical group of bytes are connected to a vertical byte access conducting path which is unique to that vertical group. A conventional field effect byte access transistor is located between the vertical byte access conducting path and the first control gate of each eight-cell byte. The control gates of the select transistors of all bytes in a selected horizontal row in the array are connected to a horizontal select transistor conducting path which is unique to that row. The control gate of each byte access transistor in the selected row is connected to the select transistor conducting path for that row. The drains of the select transistors of a selected column of cells in the array are connected to a vertical conducting path which is unique to that column. The select and storage transistors of an individual memory cell in the array are connected in series such that when both transistors are turned on, they sink current from the vertical conducting path connected to the drain of the select transistor of that cell.

Before a byte of the above-described array is reprogrammed, all storage transistors of the selected byte are erased by returning them to a charged state. To accomplish this, both the select transistor conducting path for the horizontal row containing the selected byte and the storage transistor conducting path for the selected byte are raised to high voltage. That is, for each memory cell of the selected byte, both the control gate of the select transistor and the control gate of the storage transistor are high. This requires that the vertical byte access conducting path for that group of bytes be at high potential so that the byte access transistor for that byte is turned on. All of the remaining vertical conducting paths of the array are grounded. This condition forces electrons through the tunnel oxide of each storage transistor of all memory cells in the selected byte to change the floating gate of each transistor. Thus, all of the memory cells of the selected byte are nonconducting when a read voltage is applied.

Information is written into the selected byte by selectively discharging cells. This is done by grounding the storage transistor conducting path for the selected byte while maintaining the select transistor conducting path for that byte at high potential. Simultaneously, high voltage is applied to the vertical conducting path connected to the drains of those individual cells of the selected byte in which it is desired to write. This causes the floating gates of these cells to discharge. The vertical conducting paths for the remaining cells in the selected byte are maintained at ground. Thus, the charged state of these remaining cells is unchanged. The control gates of the select transistors for non-selected bytes are grounded to prevent the programmed storage transistors in the unselected bytes from discharging.

Reading of binary data from a memory cell of the above-described array is accomplished by applying a positive bias to the control gate of both the select and storage transistor of a cell. A cell having a discharged floating gate will conduct while a cell having a charged floating gate will not conduct.

In another type of floating gate E²PROM memory cell, the select region and the storage region are formed together in a single oxide-isolated portion of a semiconductor chip. A polysilicon floating gate is formed over one side of the active region to define the storage region of the cell. The floating gate is isolated from a p-type well beneath it by the normal gate oxide and by a length of thin oxide. An aluminum control gate is formed over the floating gate. The control gate extends beyond the floating gate and over the other side of the active region to define the select region. N-doped regions are formed in the underlying p-type well adjacent both edges of the control gate to serve as source and drain. The aluminum control gate is separated from the floating gate by a layer of silicon nitride/silicon oxide. The silicon nitride enhances the capacitive coupling between the control gate and the floating gate. The p-type well is common to all memory cells of the array.

This type of E²PROM memory cell is erased as electrons are discharged from the polysilicon floating gate to the underlying p-type well. This is accomplished by first grounding the control gate of the cell and then applying high voltage to the p-type well. This causes electrons to tunnel from the floating gate, through the thin oxide and to the p-type well, causing the floating gate of the storage transistor to acquire a net positive charge. By relying on raising the potential of the entire p-type well for erasure, however, this type of E²PROM foregoes individual cell control.

To write binary data into an erased cell, the p-type well is grounded. The drain is connected through a load resistance to a high voltage. The source of the storage transistor is connected either to a high voltage or to ground depending upon the type of binary data to be stored. To initiate writing, the control gate of the selected cell is raised to high voltage. If the source is also at high voltage, the select region of the cell prevents electrons from flowing through the channel layer and the surface of p-type well beneath the floating gate becomes depleted of electrons. Since, under these conditions, only a small potential difference exists between the surface of the p-type well and the floating gate, no electrons tunnel into the floating gate, there is no change in the potential of the floating gate and the memory cell remains in an erased state.

In contrast, if the source potential is low, then the select region allows electrons to flow. This causes the surface potential under the floating gate to drop low. Electrons from the channel inversion layer pass through the thin oxide and into the floating gate, causing it to acquire a net negative potential.

To the control gate, the charging and discharging of the floating gate look like changes in the threshold voltage of the storage region of the cell. Thus, the binary state of the cell is read by comparing the conductance of the selected memory cell with the conductance of a reference cell.

SUMMARY OF THE INVENTION

The present invention provides an electrically erasable programmable read-only memory (E$^2$PROM) which utilizes an inhibit voltage applied to unselected word lines during writing to prevent writing in unselected rows. The E$^2$PROM of the present invention includes a plurality of memory cells arranged in a matrix to form a plurality of rows and a plurality of columns of such cells. Each memory cell utilizes a floating gate field effect transistor. The array also includes a plurality of electrically conducting word lines. The control gates of the floating gate transistors of the memory cells in an individual row of the matrix are connected to a corresponding of the word lines. The array further includes a plurality of electrically conducting bit lines. The drains of the field effect transistors of the memory cells in an individual column of the matrix are connected to a corresponding of the bit lines. The array further includes a plurality of electrically conducting source lines. The sources of the field effect transistors of the memory cells in an individual column of the matrix are connected to a corresponding of the source lines.

Means are provided for applying an erase voltage to a selected one of the word lines and simultaneously maintaining each of the unselected word lines and each of the bit lines and the source lines at zero potential such that the floating gate of each memory cell which is connected to the selected word line is charged to a high threshold voltage.

Furthermore, means are provided for maintaining a selected of the word lines at zero potential and simultaneously applying an inhibit voltage, which is less than the erase voltage, to the unselected word lines, applying a write voltage to selected of the bit lines and maintaining unselected bit lines at zero potential such that the floating gate of each memory cell connected to the selected of the bit lines discharges to a low threshold voltage.

The E$^2$PROM of the present invention further provides means for applying a read voltage to a selected word line, the read voltage being greater than the low threshold voltage and less than the high threshold voltage, and simultaneously maintaining unselected word lines at zero potential, applying a small potential to selected of the bit lines and maintaining unselected bit lines at zero potential such that those memory cells connected to the selected of the bit lines and having charged floating gates are nonconducting and those memory cells connected to the selected of the bit lines and having discharged floating gates are conducting.

The E$^2$PROM of the present invention further provides means for monitoring whether selected of the memory cells of the memory array are conducting or nonconducting.

The E$^2$PROM of the present invention provides numerous advantages over the prior art. The E$^2$PROM of the present invention allows each memory cell of the memory array to consist of a single floating gate field effect transistor as compared with the select region/storage region structure of conventional E$^2$PROM memory cells. One transistor per bit instead of two substantially increases the density of the array. The E$^2$PROM of the present invention provides for row erase and single bit write. There is no current flow in the array of the present invention during erase or write operations except for minute tunneling current. Furthermore, there is no field inversion problem in the array of the present invention during erase operations, that is, during application of the largest voltage, because both the source and drain of each transistor in the array are at ground. Full electrical erase of the array with selective bit writing as opposed to the nonselective chip erase of UV-erasable EPROMs speeds test time and increases application to in situ data changes.

The present invention also provides a decoder of the type having a plurality of output rows for providing signals to the word lines of the E$^2$PROM of the present invention. The dynamic decoder includes both means for directing an erase voltage to a selected one of the plurality of output rows while maintaining unselected output rows at zero potential and means for maintaining a selected one of the plurality of output rows at zero potential while directing an inhibit voltage to unselected output rows. The decoder of the present invention may be either a static decoder or a dynamic decoder.

The present invention also provides a method for maintaining a floating gate field effect transistor in the enhancement mode. According to the method, the threshold voltage of the transistor is reduced by a specific amount. The reduced threshold voltage is then compared with a desired threshold voltage. If the reduced threshold voltage is below the desired threshold voltage, then the reduced threshold voltage is maintained. If the reduced threshold voltage is above the desired threshold voltage, then the sequence is repeated.

The present invention further provides a memory cell which utilizes a composite floating gate field effect transistor. An extended source region rather than the drain region is used to contain the thin oxide.

BRIEF DESCRIPTION OF THE DRAWINGS

The above and other advantages and features of the present invention will become more readily apparent from a review of the following detailed description when taken in conjunction with the drawings wherein.

DETAILED DESCRIPTION OF A PREFERRED EMBODIMENT

Figure 1:
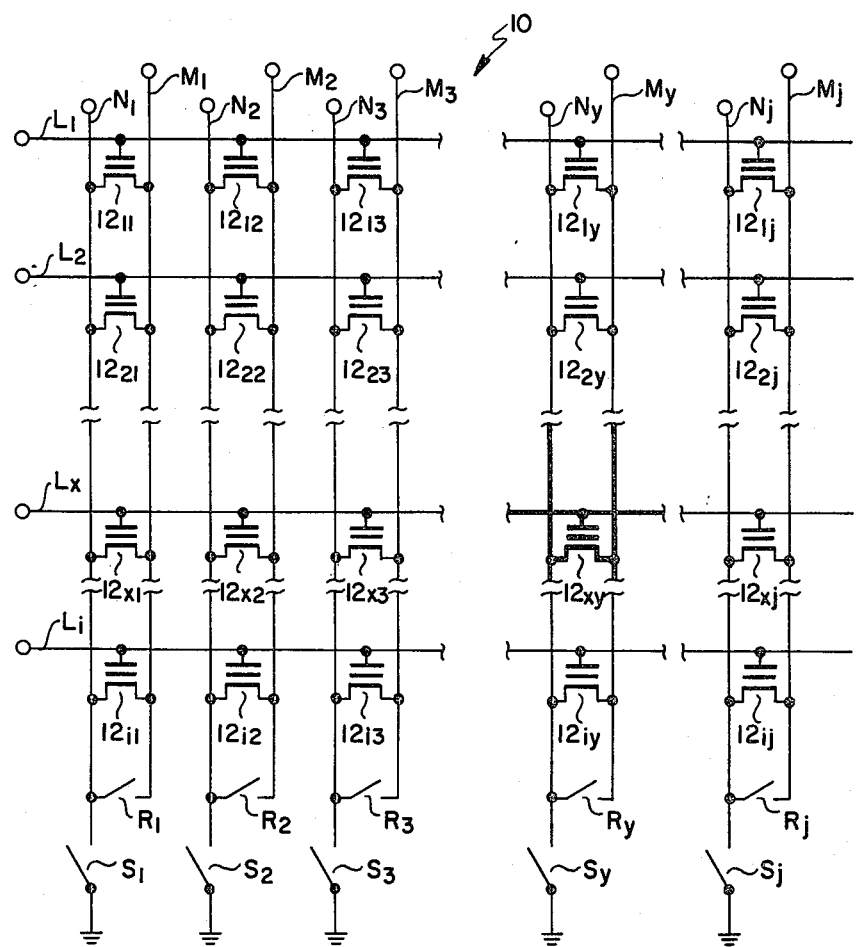
FIG. 1 is a schematic illustration of an E$^2$PROM memory array in accordance with the teachings of the present invention.

FIG. 1 shows a memory array 10 of the E²RPOM of the present invention. The array 10 includes a plurality of memory cells which are formed as a matrix of mutually perpendicular rows 1-i and columns 1-j, where both i and j are integers. Each of the memory cells of the array 10 utilizes a floating gate field effect transistor. As illustrated schematically in FIG. 1, in the preferred embodiment of the invention, each memory cell consists of a single floating gate field effect transistor $12_{xy}$.

Figure 2:
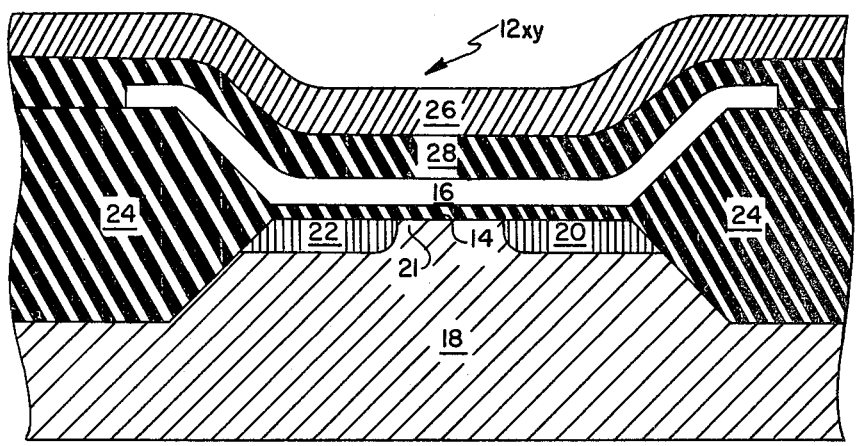
FIG. 2 is a cross-section of one embodiment of a memory cell which may be utilized in the present invention.

FIG. 2 shows one embodiment of a transistor $12_{xy}$ in detail. Except for a thin layer of silicon dioxide 14, which is about 200 Angstroms or less thick, transistor $12_{xy}$ can be a typical floating gate field effect transistor the structure of which is well-known. It is noted, however, that preferred embodiments of transistor $12_{xy}$ which improve the performance of the E²PROM of the present invention are described in detail below.

The transistor $12_{xy}$ shown in FIG. 2 includes a thin layer of silicon dioxide 14 formed between a floating gate 16 and an underlying p-type substrate 18. Both the floating gate 16 and the thin oxide 14 extend over an n-type drain region 20 and an n-type source region 22 which are formed in the p-type substrate 18 between field oxide regions 24. The drain region 20 and the source region 22 are spaced apart to define a channel region 21 which extends therebetween. Field oxide regions 24 isolate the transistor $12_{xy}$ from adjacent transistors of the array in the well-known manner. A control gate 26 is separated from the underlying floating gate 16 by a dielectric layer 28 which, typically, is either silicon dioxide or silicon nitride. The thin oxide 14 across the entire channel length produces a high transconductance and an increased memory read access speed.

Figure 3:
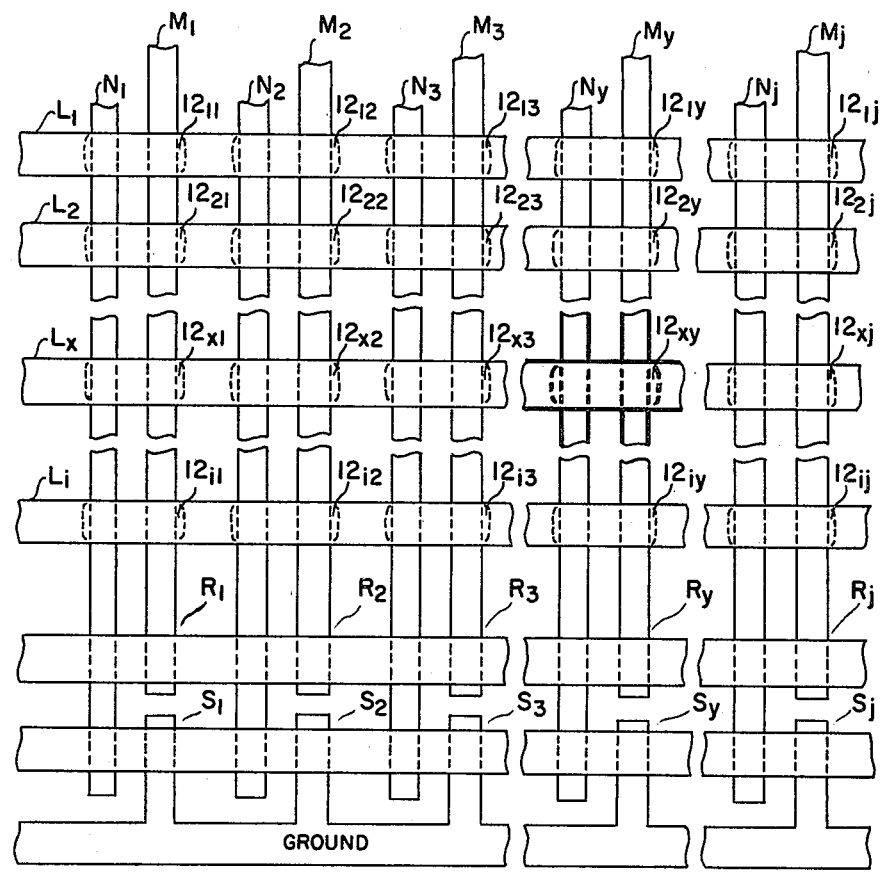
FIG. 3 is a topographical arrangement for the E$^2$PROM array illustrated in FIG. 1.

Returning to FIG. 1, the memory array 10 further includes a first plurality of conducting paths $L_1$-$L_i$ which form word lines of the memory array 10. In the illustrated embodiment, the number of word lines is coincident with the number of rows of floating gate transistors $12_{xy}$. The control gate of each transistor $12_{x1}$-$12_{xj}$ of a selected row of transistors $12_{xy}$ is connected to a corresponding word line $L_x$. For example, as shown in FIG. 1, the control gate of each transistor $12_{11}$-$12_{1j}$ is connected to word line $L_1$. FIG. 3 shows that in the preferred embodiment the word line $L_x$ actually forms the control gate of each transistor $12_{x1}$-$12_{xj}$ in the corresponding row.

The memory array 10 illustrated in FIG. 1 further includes a second plurality of conducting paths $M_1$-$M_j$ as well as a third plurality of conducting paths $N_1$-$N_j$. Conducting paths $M_1$-$M_j$ form the bit lines of the array. Conducting paths $N_1$-$N_j$ form the source lines of the array. In the illustrated embodiment, both the number of bit lines and the number of source lines are coincident with the number of columns of floating gate transistors $12_{xy}$. The drain region of each transistor $12_{1y}$-$12_{iy}$ in an individual column of transistors $12_{xy}$ is connected to a corresponding bit line $M_y$. For example, as shown in FIG. 1, the drain region of each transistor $12_{11}$-$12_{i1}$ is connected to bit line $M_1$. The source region of each transistor $12_{1y}$-$12_{iy}$ in an individual column of transistors $12_{xy}$ is connected to a corresponding source line $N_y$. For example, as shown in FIG. 1, the source region of each transistor $12_{11}$-$12_{i1}$ is connected to source line $N_1$. FIG. 3 shows that in the preferred embodiment the bit lines and source lines actually form the drain and source, respectively, of each transistor $12_{1y}$-$12_{iy}$ in the corresponding column.

As shown in FIG. 1, each pair of bit lines and source lines for an individual column of transistors $12_{1y}$-$12_{iy}$ is interconnected following the last such transistor in that column through a switch $R_y$. As explained in detail below, the switch $R_y$ of a column is closed during writing to equalize the potential of the source and drain regions of the transistors in that column. FIG. 3 shows an embodiment wherein the switches $R_1$-$R_j$ are conventional field effect transistors.

Furthermore, each pair of bit lines and source lines is connected to ground through a switch $S_y$. FIG. 3 shows an embodiment wherein the switches $S_1$-$S_y$ are conventional field effect transistors.

Figure 4:
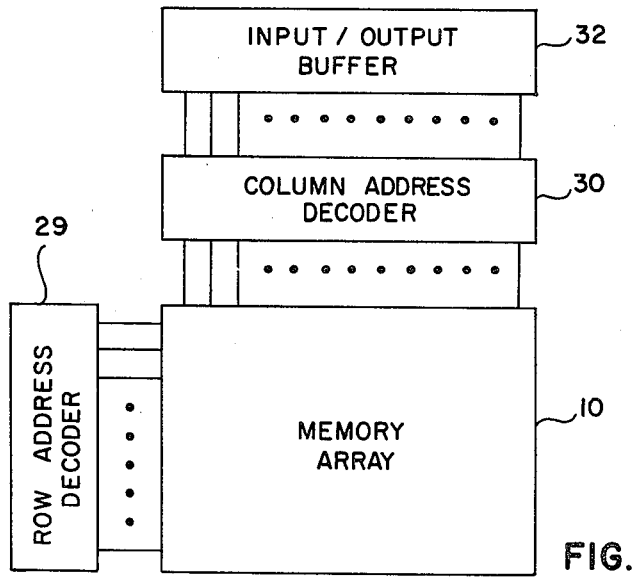
FIG. 4 is a block diagram of addressing and output buffer circuits connected to the E$^2$PROM array of the present invention.

Referring now to FIG. 4, for purposes of erasing, writing and reading the E²PROM of the present invention, the memory array 10 is connected to a row address decoder 29, a column address decoder 30 and an input/output buffer 32. Row address decoder circuit 29 provides desired voltage signals to the individual word lines, i.e., conducting paths $L_1$-$L_i$, of the array 10. Column address decoder 30 provides desired voltage signals to the individual bit lines, i.e., conducting paths $M_1$-$M_j$, of the array 10. Input/output buffer circuit 32 monitors whether selected transistors $12_{xy}$ are conducting or non-conducting.

Binary data stored in the memory array 10 is represented by the charged or discharged state of the floating gates of the transistors $12_{xy}$. A transistor $12_{xy}$ having a charged floating gate will have a high threshold voltage $V_{th}$. A transistor $12_{xy}$ having a discharged floating gate will have a low threshold voltage $V_{t1}$. Thus, on application of an intermediate read voltage $V_r$, a transistor $12_{xy}$ will not conduct if its floating gate is charged. Conversely, if the floating gate of a transistor $12_{xy}$ is not charged, it will conduct on application of $V_r$. This conducting or nonconducting state of a transistor $12_{xy}$ is therefore representative of the binary data stored therein.

The E²PROM of the present invention is erased by applying a positive erase voltage $V_e$ to a selected one of the word lines $L_x$. Simultaneously, each of the nonselected word lines as well as each of the bit lines and each of the source lines is maintained at zero potential. In the illustrated embodiments, the bit and source line voltages are equalized by closing the switches $R_1$-$R_y$. In this manner, the erase voltage $V_e$ is applied to the control gate of each transistor $12_{x1}$-$12_{xj}$ of the row of transistors $12_{xy}$ connected to the selected word line $L_x$. For each of the transistors $12_{x1}$-$12_{xj}$ in the selected row, the capacitive coupling between the control gate and the floating gate causes an electric field across the underlying thin oxide. The electric field is sufficient to cause tunneling of electrons to the floating gate such that the floating gate becomes charged. With its floating gate charged, each of the transistors $12_{x1}$-$12_{xj}$ in the selected row assumes the high threshold voltage $V_{th}$.

To write binary data into the selected row of transistors $12_{x1}$-$12_{xj}$, selected word line $L_x$ is maintained at zero potential. According to the present invention, at the same time, an inhibit voltage $V_i$ is applied to all unselected word lines such that voltage $V_i$ is applied to the control gate of each transistor $12_{xy}$ in all of the unselected rows. Voltage $V_i$ is sufficiently less than $V_e$ such that an erase condition in the unselected rows is not presented. A positive writing voltage $V_w$ is either simultaneously or subsequently applied to selected of the bit lines; nonselected bit lines are maintained at zero potential. For those transistors $12_{x1}$-$12_{xj}$ of the selected row for which the interconnecting bit line has also been selected, these conditions create an electric field across the thin oxide which causes electrons to tunnel from the floating gate to the underlying drain region. With its floating gate discharged, each of these transistors $12_{xy}$ assumes the low threshold voltage $V_{tl}$. All other transistors in the selected row maintain the high threshold voltage $V_{th}$. Thus, the E²PROM of the present invention provides for row erasure and single bit writing.

For those transistors $12_{xy}$ connected to selected of the bit lines but not in the selected row of transistors $12_{x1}$-$12_{xj}$, voltage $V_i$ prevents writing by making the floating gate of these transistors more positive and thus reducing the field over the drain region to below the critical value for writing. This occurs because the floating gate is capacitively coupled to the control gate which allows a portion of the inhibit voltage $V_i$ to be coupled to the floating gate. Thus, in unselected rows, the inhibit voltage are maintained at zero potential. A small potential, preferably about +2.0 volts, which is sufficiently small to prevent significant long term weak writing, is applied to the bit line $M_y$ connected to the selected transistor $12_{xy}$. The unselected bit lines are maintained at zero potential or disconnected. If the selected transistor $12_{xy}$ has a charged floating gate, then the read voltage $V_r$ will be insufficient to turn the transistor $12_{xy}$ on. Conversely, if the selected transistor $12_{xy}$ has a discharged floating gate, then the read voltage $V_r$ will be sufficient to turn the transistor $12_{xy}$ on. The input/output buffer circuit 32 monitors whether the selected transistor $12_{xy}$ is conducting or nonconducting.

The combination of voltages for the above described modes of the E²PROM of the present invention are summarized in Table I.

TABLE I

VOLTAGE CONDITIONS FOR VARIOUS MODES OF THE MEMORY ARRAY

|  | Erase | Write | Read |
|---|---|---|---|
| Selected Word Line | $V_e$ | 0 | $V_r$ |
| Unselected Word Lines | 0 | $V_i$ | 0 |
| Selected Bit Lines | 0 | $V_w$ | Small+ |
| Unselected Bit Lines | 0 | 0 | Ground or Disconnected |

Table II shows measured data for a discrete n-channel floating gate field effect transistor.

In the above discussion, the transistors $12_{xy}$ of the memory array 10 are described as being n-type floating gate field effect transistors. It should be understood that the E²PROM of the present invention could utilize a memory array 10 wherein the transistors $12_{xy}$ are p-type floating gate field effect transistors

TABLE II

MEASURED RESULTS OF DISCRETE TRANSISTOR TESTING

|  |  |  |  | MODE | | | | | |
|---|---|---|---|---|---|---|---|---|---|
|  |  |  |  | Read | | Erase | | Write | Write Disturb |
|  | Name | Voltage Symbol | Unit | Read 1 | Read 0 | Selected Row Erase | Unselected Row Erase | Selected Row and Column Write 1 | Unselected Columns and Rows Write 0 (Don't Write 1) | Unselected Rows Write 1 |
| Condition | Drain | $V_d$ | V | 2.0 | 2.0 | 0 | 0 | $V_w$=12.0 | 0 | $V_w$=12.0 or 0 |
|  | Gate | $V_g$ | V | $V_r$=4.0 | $V_r$=4.0 | $V_e$=18.0 | $V_e$=18.0 | 0 | $V_i$=12.0 or 0 | $V_i$=12.0 |
|  | Source | $V_s$ | V | 0 | 0 | 0 | 0 | $V_w$=12.0 | 0 | $V_w$=12.0 or 0 |
|  | Substrate | $V_d$ | V | 0 | 0 | 0 | 0 | 0 | 0 | 0 |
| Result | Drain to Source Current | $I_{ds}$ | mA | 0.5 | 0 | 0 | 0 | 0 | 0 | 0 |
|  | $V_t$ | $V_{th}$ or $V_{tl}$ | V | 1.5 | 4 | 5V | No change | 0.5 to 1.5 | No change | No change |

$V_t$ measured at $V_d$=2.0 V, $V_s$=$V_{sub}$=0 $I_{ds}$=10 A
Write performed by a single pulse of 12.0 V, duration 2.0 msec.
Write disturb. $3 \times 10^4$ $V_w$ pulses age $V_i$ prevents substantial threshold decrease and in unselected columns is insufficient to cause a substantial positive threshold shift.

To read binary data from a selected transistor $12_{xy}$ of the memory array, a read voltage $V_r$ is applied to the word line $L_x$ connected to the row containing the selected transistor $12_{xy}$. Read voltage $V_r$ is greater than the low threshold voltage $V_{tl}$ and less than the high threshold voltage $V_{th}$. Typically, $V_r$ is slightly less than $V_{th}$. This provides maximum overdrive of the low threshold transistors without turning on high threshold transistors. At the same time that $V_r$ is applied to the selected conducting path $L_x$, the unselected word lines Of course, if p-type transistors are utilized, then those skilled in the art will recognize that the polarity of the voltages applied to the array for erasure, writing and reading must be reversed.

Figure 5:
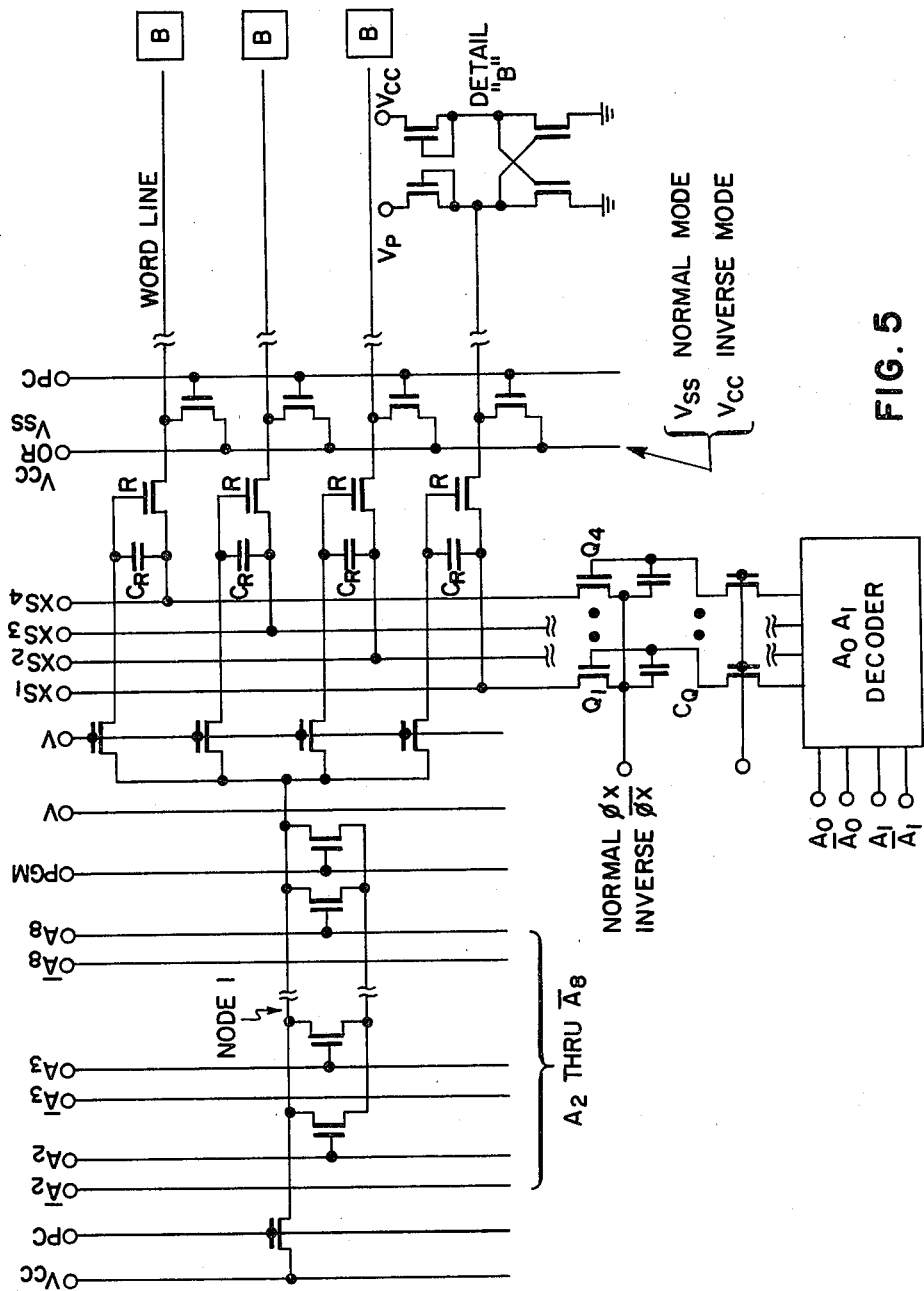
FIG. 5 is a schematic illustration of an embodiment of a row address decoder which may be utilized in the present invention.

FIG. 5 shows an embodiment of a row address decoder circuit 29 which may be utilized to provide appropriate signals to the word lines, conducting paths $L_1$-$L_i$, of the memory array 10 described above. While the dynamic decoder circuit shown in FIG. 5 is itself conventional, a new operating mode, which is described in detail below, enables it to produce either normal or complementary outputs without increasing its area. This feature makes it particularly useful for operation of the E²PROM of the present invention.

The new operating mode exploits the fact that the transfer gates in MOS dynamic logic can conduct in either direction. Thus, when a gate is turned on, its output may rise or fall depending upon the precharge conditions established prior to turning it on.

In the conventional mode, utilizing the circuit shown in FIG. 5 as an example, a positive signal $\phi X$ is directed to one of the 512 output rows by one of the 4 transfer gates Q selected by the address bits $A_0$-$A_1$ and by one of the 128 groups of 4 gates R selected by address bits $A_2$ through $A_8$. For all 511 unselected output rows, the path of signal $\phi X$ is blocked by one or more non-conducting transfer gates.

While FIG. 5 shows a decoder having 512 output rows, in the general case, the number of output rows of the decoder corresponds to the number of word lines of the memory array 10.

Figure 6:
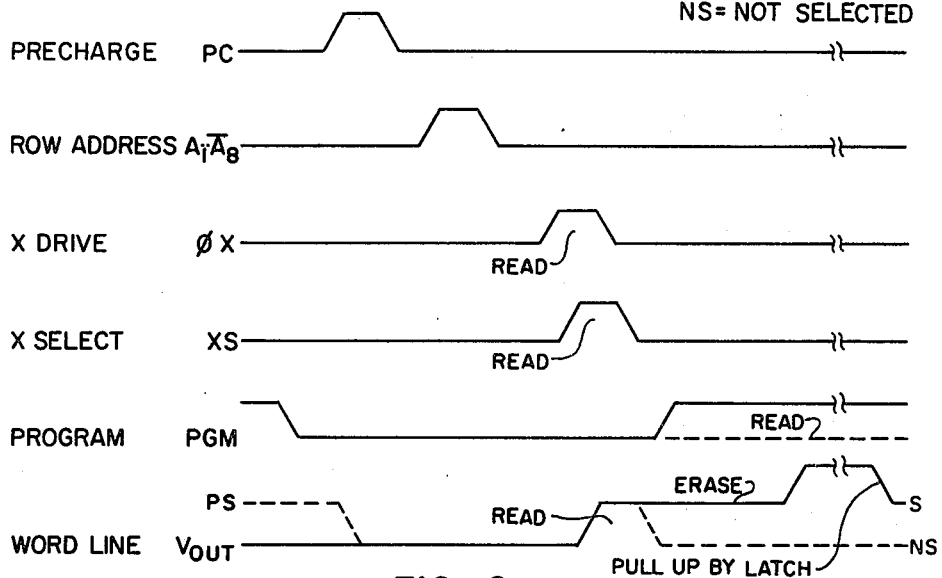
FIG. 6 shows a timing sequence for the decoder illustrated in FIG. 5 operated in the normal mode.

The timing for the conventional mode is shown in FIG. 6. All nodes 1 are precharged to $V_{cc}$ and all rows are precharged to ground. After address signals are decoded, one of the 4 transfer gates Q and one group of 4 of the transfer gates R is turned on. Signal $\phi X$ then propogates through the circuit, in the auto bootstrapped mode, to the selected output row of the circuit and, hence, to the selected word line, word line $L_x$, of the memory array. After decoding, the programming control signal PGM shuts off all transfer gates R if the time the selected output row is to be held high exceeds the holding time of the dynamic nodes. The rows are then controlled by the latches independently of the decoding circuitry.

For the inverse mode, that is, where the selected output row is low and the other output rows are high, two changes are made in the operation. First, the row precharge supply is set at $V_{cc}$ instead of $V_{ss}$. Second, $\phi X$ is inverted, going low after decoding instead of high. The following inverse operation sequence is utilized. During precharge, PC sets all rows, X select lines and transfer gates positive. After decoding, only the selected output row has a conducting path to the $\phi X$ driver the output of which remains high. Signal $\phi X$ is driven low and sinks the charge from the selected output row by reverse conduction through the appropriate transfer gates Q and R. The PGM signal turns off all gates R, leaving the rows latched and independent of the dynamic decoding and driving circuits. After decoding the rows with all power supplies and signals at conventional levels (typically OV or SV) the rows are pulled to the higher voltage ($V_E$ or $V_i$) by appropriately setting the voltage supply to the row latches.

Figure 7:
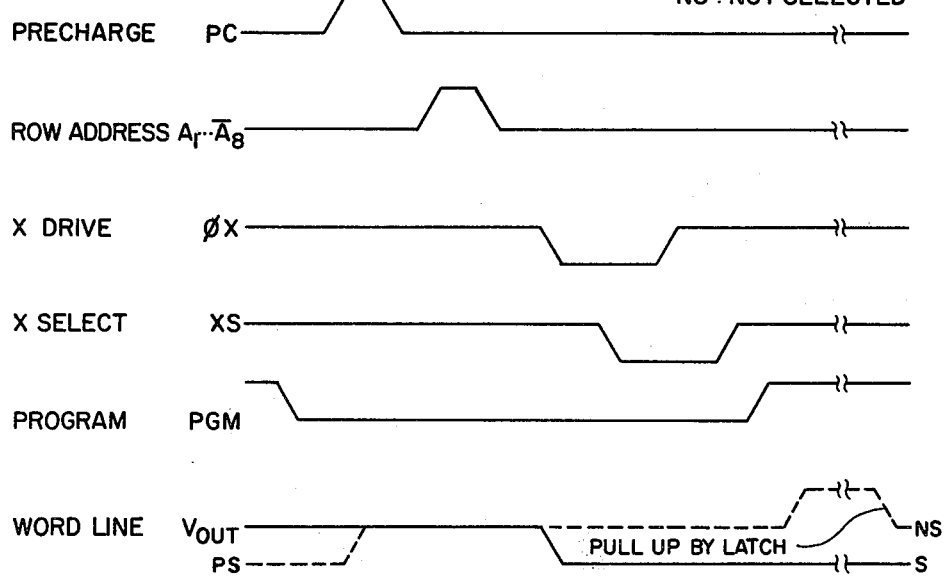
FIG. 7 shows a timing sequence for the decoder illustrated in FIG. 5 operated in the inverse mode.

The timing sequence for the inverse mode is unchanged from that for the conventional mode. Timing intervals may need to be extended since the design is typically optimized for fast forward propogation to the shortest read access time rather than for fast reverse propogation. The timing for the inverse mode is shown in FIG. 7.

It should be noted that auto-bootstrapping allows signal $\phi X$ to propogate through the transfer gates without voltage loss in the forward direction. In the reverse propogation, the bootstrap coupling capacitors $C_Q$ and $C_R$ reduce the gate voltage and, consequently, the conductance of the transfer gates. The time of signal $\phi X$ may need to be extended accordingly.

Figure 8:
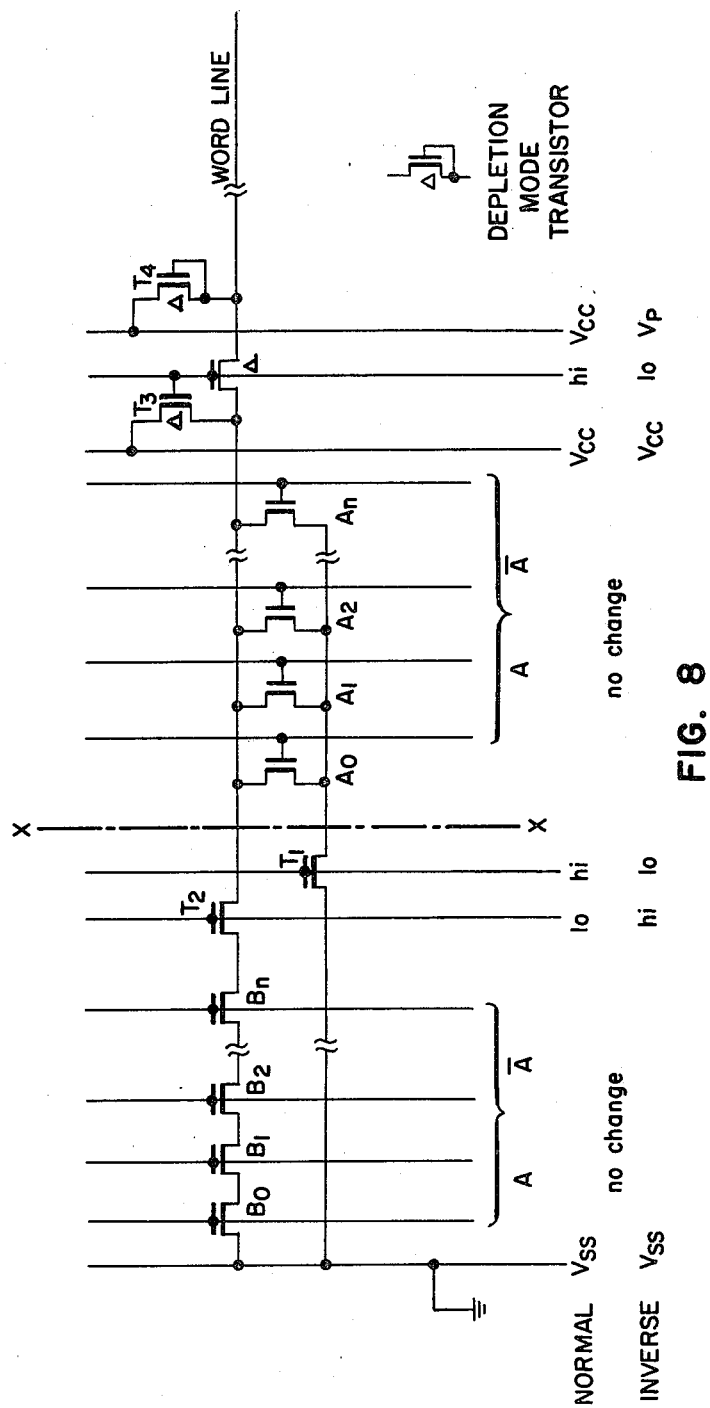
FIG. 8 is a schematic illustration of an alternative embodiment of a row address decoder which may be utilized in the present invention.

FIG. 8 shows an alternative embodiment of a row address decoder circuit which also may be utilized to provide appropriate signals to the word lines of memory array 10 of the E²PROM of the present invention. The static decoder shown in FIG. 8 produces a selected output which is either high or low with all unselected outputs high. The additional function may be achieved without increasing the height of the decoder.

As shown in FIG. 8, the static decoder circuit comprises a conventional NOR gate static decoder on the right of line XX and additional series decoding transistors forming a NAND gate on the left of line XX.

The interconnection pattern within the decoder is arranged such that in any selected row, the NOR and NAND gates always have complementary outputs. Transistors T1 and T2, with the logic inputs shown in FIG. 8, determine whether the normal (NOR) or the inverse (NAND) output is selected.

In the inverse mode, the gates of the normal mode pull-up transistors T3 are grounded to reduce the current flow and voltage drop across the series NAND gate. The current passed is small and limited by transistor T4 which is a long device for limited current.

Figure 9:
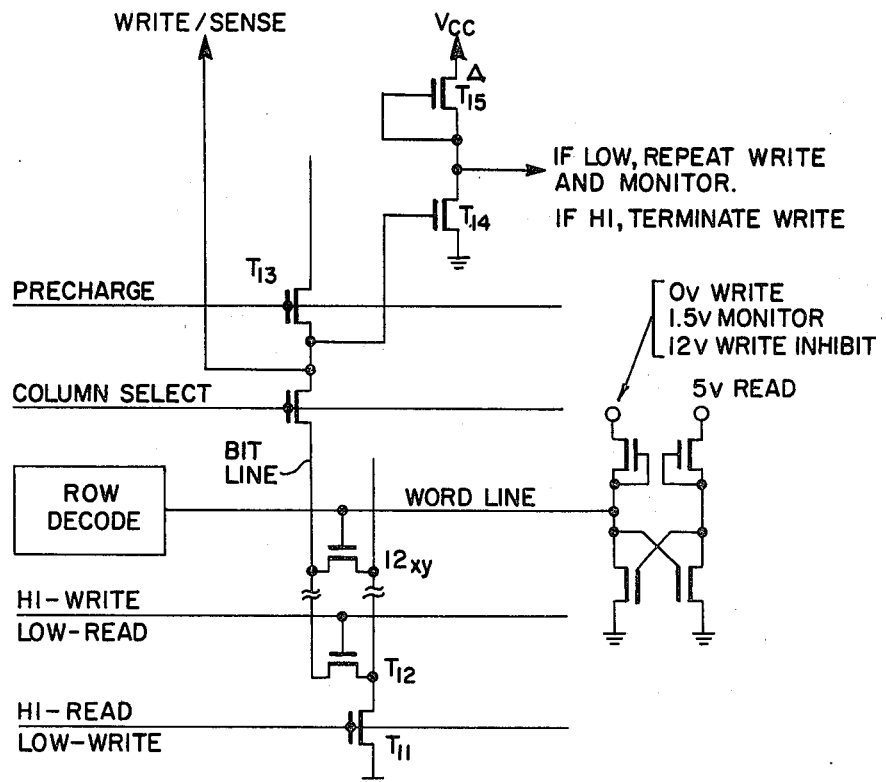
FIG. 9 is a schematic illustration of a circuit which may be utilized to prevent the depletion mode in floating gate memory cells utilized in the present invention.

For the floating gate memory cells of the memory array 10 described above, both the high and low threshold states, representing the stored binary data, must be greater than zero. That is, each memory cell must operate in the enhancement mode. If the threshold voltage becomes negative and the memory cell enters the depletion mode, then a failure will occur because the memory cell will remain conducting when its control gate is grounded. FIG. 9 shows circuitry for maintaining the memory cells of the array 10 in the enhancement mode.

In UV-erasable EPROMs, the threshold of each field effect memory transistor is restored to about the virgin value, typically about +1.0 to +1.5 volts, by ultraviolet erasure and is self-limiting. For electrically erasable memory transistors, the negative shift in threshold during discharge of the floating gate is not self-limiting. Consequently, the threshold may be driven into deep depletion during writing.

According to a new method for preventing depletion which is described hereinbelow, the threshold is shifted in the negative direction a step at a time. After each step, a sense amplifier is used to monitor whether the threshold is above or below the desired value. As soon as the threshold is below the desired value, electrical writing is stopped.

Typical conditions in a normal read mode are the following: high threshold voltage $V_{th}$ is greater than +5.0 V, low threshold voltage $V_{tl}$ is about 1.0 V, read voltage $V_r$ on the control gate is about 5.0 V, overdrive of the high threshold is 0 V and overdrive of the low threshold is about 4.0 V. The 4.0 V low threshold overdrive is required to cause adequate speed in discharging the bit line, conducting path $M_y$.

The above conditions would be modified to the following sequence in the depletion monitoring mode: bit line (conducting path $M_y$) precharged to 2.0 V, read voltage $V_r$ applied to the control gate is 1.5 V, time allowed for discharge of conducting path $M_y$ (approx. 100 X normal access time) is 10 microseconds, output of the monitoring device is tested. If the output of the monitoring device is low, then the writing pulse is repeated. If the output of the monitoring device is high, the writing cycle is terminated.

Referring to FIG. 9 after a writing cycle, with the memory transistor source and drain at +12 V and the control gate at 0 V, T11 is turned on, T12 is turned off and the bit line, i.e. conducting path $M_y$, is precharged to 2.0 V through T13. The latch of the word line, i.e. conducting path $L_x$, supplies 1.5 volts to the gate of transistor $12_{xy}$. After sufficient time, about 10 microseconds, the bit line $M_y$ is discharged if the threshold of transistor $12_{xy}$ is below 1.5 V. This discharge causes the drain, i.e. the output of transistor T14, to go high and signals the end of the write mode. If the output of transistor T14 is low, another write and monitor cycle is initiated. Transistor T15 pulls the drain of transistor T14 high if transistor T14 is off.

Figure 10:
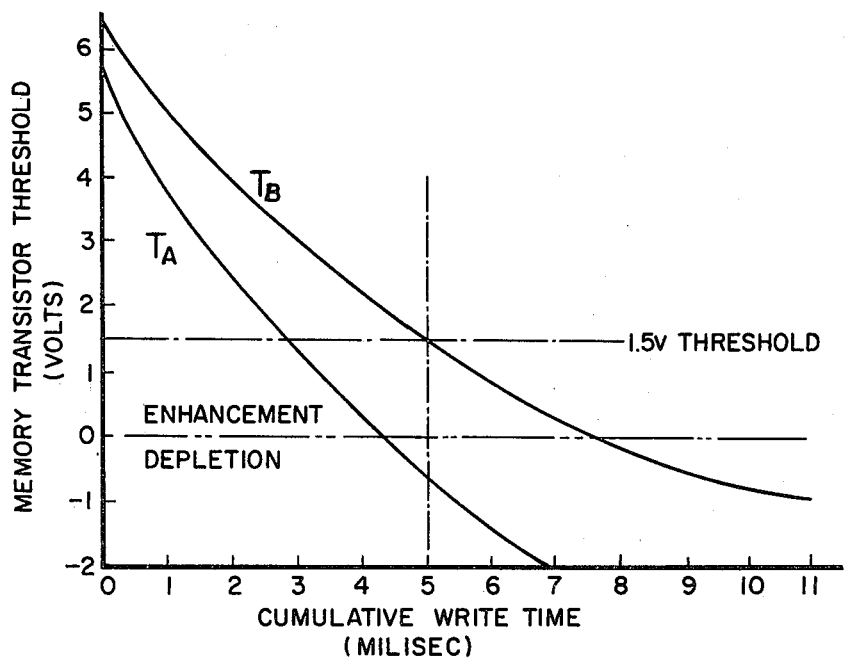
FIG. 10 is a graph showing threshold voltage versus cumulative writing time for two memory cells TA and TB.

FIG. 10 shows different writing characteristics for two transistors, TA and TB. For transistor TA, threshold $V_t = 1.5$ V is reached after 2.75 milliseconds. In this time period, the threshold of transistor TB has reached only 3.25 V. About 5 milliseconds is required for transistor TB to reach 1.5 V, whereas this length of writing time drives transistor TA in depletion, i.e., $V_t = 0.5$ V. If both transistors are written 0.5 millisecond steps, then at $V_t = 1.5$ V the shifts are approximately 0.5 V. Since the writing mode for each can be terminated independently, both thresholds may be set at 1.5 V maximum with a possible extra 0.5 V step driving them to 1.0 V minimum.

Figure 11:
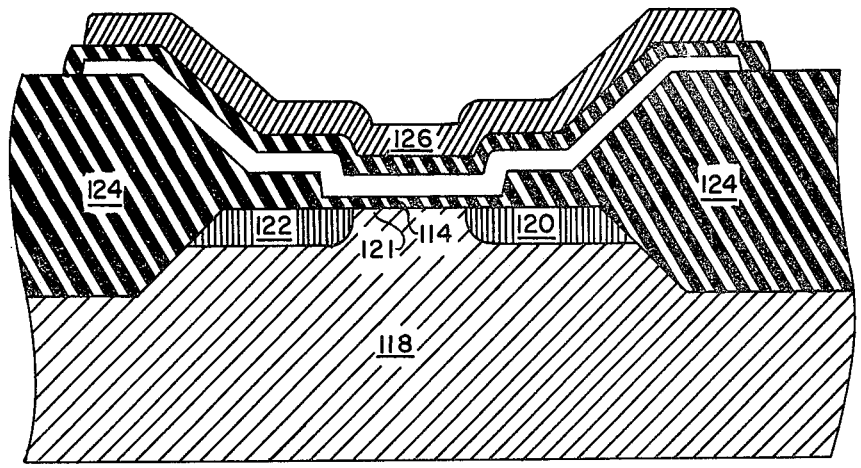
FIG. 11 is a cross-sectional illustration of an alternative embodiment of a memory cell which may be utilized in the present invention.

FIG. 11 shows an embodiment of a single transistor memory cell which may be utilized in the electrically erasable programmable read only memory of the present invention. The memory cell consists of a transistor 112 which includes a layer of tunnel oxide 114 formed between the floating gate 116 and the underlying p-type substrate 118. Both floating gate 116 and tunnel oxide 114 extend over n-type drain region 120 and n-type source region 122 which are formed in the p-type substrate 118 between field oxide regions 124. Drain region 120 and source region 122 are spaced apart to define a channel region 121. Field oxide regions 124 isolate the transistor 112 from other transistors in the array in the well-known manner. The control gate 126 of transistor 112 is separated from the underlying floating gate 116 by a dielectric layer 128 which, typically, is either silicon dioxide or silicon nitride.

The key requirement for the transistor 112 shown in FIG. 11 is that the junction breakdown voltage be greater than the tunneling voltage. Otherwise, junction breakdown will clamp the voltage below the tunneling value.

Typically, the junction breakdown voltage is reduced when the floating gate is separated from the surface of the silicon substrate by oxide thin enough for tunneling, rather than by a thicker oxide as used in a conventional field effect transistor. However, by using a refractory metal such as molybdenum, rather than polysilicon, for the floating gate 116 of transistor 112, the field required for tunneling is reduced. Thus, the tunneling voltage is reduced below the breakdown voltage despite the thin oxide over the junction.

The tunneling voltage required at the drain 120 of the transistor 112 is further reduced when the floating gate 116 is negatively charged because an internal field is produced in the direction required to discharge the floating gate 116. This aids the field produced by the externally applied drain voltage.

In tests of transistors constructed according to the structure shown in FIG. 11, the floating gate was negatively charged by applying +18 V to the control gate 126. This produced a threshold voltage greater than +5.0 V. The gate was then discharged by a drain voltage as small as +10.0 V to +12.0 V. The junction breakdown voltage exceeded 14.0 V.

Figure 12:
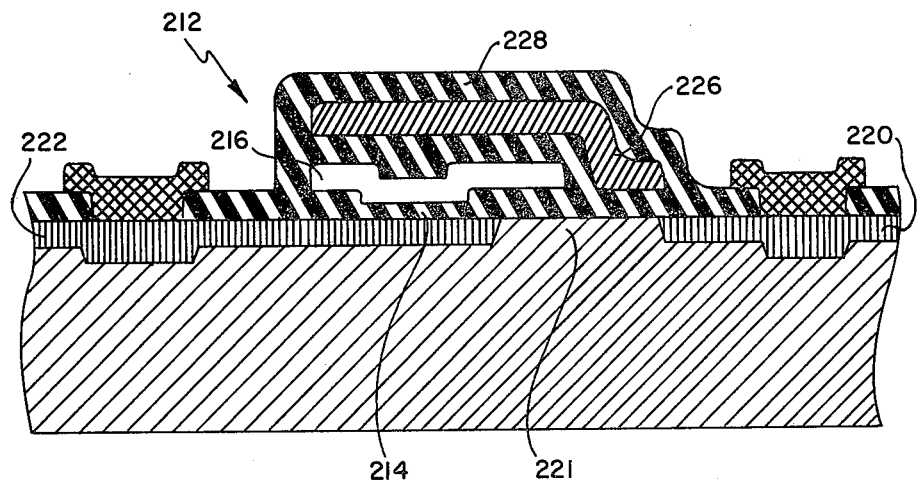
FIG. 12 is a cross-section illustration of a further alternative embodiment of a memory cell which may be utilized in the present invention.

If the presence of the thin oxide over the junctions causes the breakdown voltage to be lower than the writing voltage, then the voltage thin oxide region has to be physically separated from the drain junction as shown in FIG. 12. However, the operating sequence remains unchanged.

In the composite transistor 212 shown in FIG. 12, a floating gate 216 only partially covers the length of a channel region 221 while a control gate 226 covers the entire length of the channel region 221. This allows the threshold under the floating gate 216 to be driven into depletion without conduction occurring when the control gate 226 is grounded. The control gate 226 and floating gate 216 are separated by an insulator material 228, typically silicon dioxide. A thin oxide layer 214 is formed over an extended source region 222 of the transistor 212, rather than over the drain region 220 as is conventional.

Figure 13:
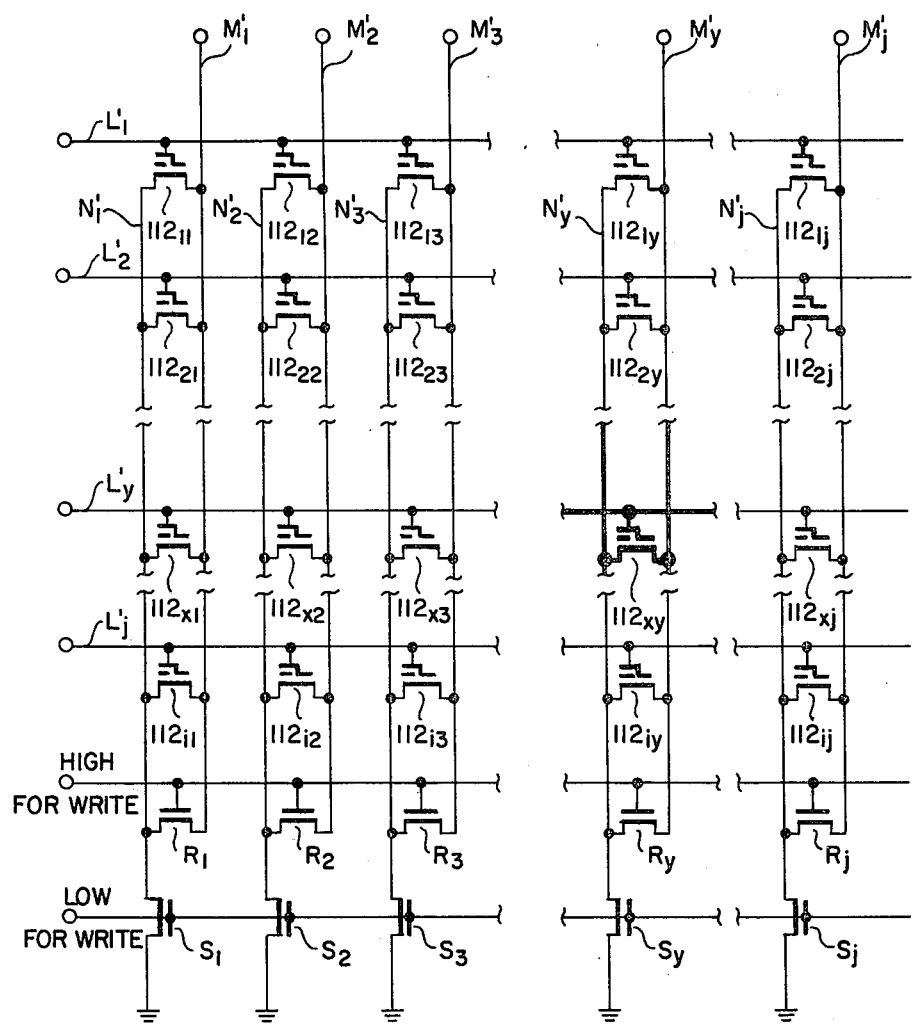
FIG. 13 is a schematic illustration of an E²PROM array in accordance with the teachings of the present invention which utilizes the memory cell shown in FIG. 12.

An array organization which utilizes the transistor 212 is shown in FIG. 13. The array of FIG. 13 is identical to that shown in FIG. 1 except for the substitution of transistors $212_{xy}$ for transistors $12_{xy}$ of FIG. 1. FIG. 13 shows an independent source conducting path $N_y$ in each column of transistors $212_{1y}$-$212_{iy}$. A switch, field effect transistor $R_y$, equalizes the source and drain potentials in each column during writing. A switch, field effect transistor $S_y$, isolates them from ground.

Since the control gate of transistor $R_y$ is pulled to the externally applied voltage $V_p$ by a depletion load and writing voltage is limited to a threshold below $V_p$ by the transfer gates of the column address decoder, there is no voltage drop across the memory transistors $212_{1y}$-$212_{iy}$ in a column selected for writing. Thus, when a writing voltage $V_w$ is applied to a selected bit line $M_y$, it is transferred to the source of the transistor $212_{xy}$ in the selected row with voltage loss. The effect of the writing voltage $V_w$ on transistors in the selected column other than $212_{xy}$ is inhibited by the voltage $V_i$ which is applied to unselected word lines as described above.

While various embodiments of the present invention have been disclosed, it will be understood by one skilled in the art that variations and modifications may be made therein without departing from the spirit and the scope of the invention as claimed.

What is claimed is:

1. An electrically erasable programmable read-only memory comprising:
   (a) a memory array comprising
      (i) a matrix of memory cells formed as a plurality of rows and a plurality of columns of said cells, each of said cells utilizing a floating gate field effect transistor for storage of binary data;
      (ii) a plurality of word lines, the control gate of each said transistor in a row of said memory cells being connected to a word line corresponding to said row;
      (iii) a plurality of bit lines, the drain of each said transistor in a column of said memory cells being connected to a bit line corresponding to said column; and
      (iv) a plurality of source lines, the source of each said transistor in a column of said memory cells being connected to a source line corresponding to said column;
   (b) means for applying an erase voltage to a selected word line and, simultaneously, maintaining unselected word lines as well as all bit lines and all source lines at zero potential such that the floating gate of each said transistor connected to said selected word line is charged to a high threshold voltage;

(c) means for maintaining a selected word line at zero potential and, simultaneously, applying an inhibit voltage which is less than said erase voltage to unselected word lines, applying a write voltage to selected of said bit lines and maintaining unselected bit lines at zero potential such that the floating gate of each said transistor having its drain connected to said selected of said bit lines discharges to a low threshold voltage;

(d) means for applying a read voltage to a selected word line, said read voltage being greater than said low threshold voltage and less than said high threshold voltage, and, simultaneously, maintaining unselected word lines at zero potential, applying a small potential to selected of said bit lines and maintaining unselected bit lines at zero potential such that a said transistor connected to said selected of said bit lines and having a charged floating gate is nonconducting and a said transistor connected to said selected of said bit lines and having a discharged floating gate is conducting; and (e) means for monitoring whether a selected of said transistors in said matrix is conducting or nonconducting.

2. An electrically erasable programmable read-only memory according to claim 1 wherein each of said memory cells consists of a single floating gate field effect transistor.

3. An electrically erasable programmable read-only memory according to claim 2 wherein said single floating gate field effect transistor is an n-type transistor.

4. An electrically erasable programmable read-only memory according to claim 2 wherein said single floating gate field effect transistor is a p-type transistor.

5. An electrically erasable programmable read-only memory according to claim 1 wherein each of said memory cells consists of a composite floating gate field effect transistor, said composite transistor comprising:

(a) first and second semiconductor regions of a first conductivity type, said first and second regions being physically separated by a third semiconductor region of a second conductivity type, a selected of said bit lines and a selected of said source lines being connected to said first and second regions, respectively;

(b) a first electrically conducting layer overlying said third region and at least a portion of said second region and separated from said first, second and third regions by an electrically insulating material, a portion of said insulating material between said first conducting layer and said second region being about 200 Angstroms or less thick; and (c) a second electrically conducting layer overlying said first conducting layer and also overlying the entire of said third region, said second conducting layer being separated from said first conducting layer and from said first, second and third regions by said insulating material.

6. An electrically erasable programmable read-only memory according to claim 5 wherein said insulating material is silicon dioxide.

7. An electrically erasable programmably read-only memory according to claim 6 wherein said first electrically conducting layer is a refractory metal.

8. An electrically erasable programmable read-only memory according to claim 7 wherein said refractory metal is molybdenum.

9. An electrically erasable programmable read-only memory according to claim 1 wherein said small potential is sufficiently small to prevent long-term weak writing.

10. A memory according to claim 9 wherein said small potential is about 2.0 volts.

11. An electrically erasable programmable read-only memory comprising:

(a) a memory array comprising
 (i) a matrix of memory cells formed as a plurality of rows and a plurality of columns of said cells, each of said cells utilizing a floating gate field effect transistor for storage of binary data;
 (ii) a plurality of word lines, the control gate of each said transistor in a row of said memory cells being connected to a word line corresponding to said row;
 (iii) a plurality of bit lines, the drain of each said transistor in a column of said memory cells being connected to a bit line corresponding to said column; and
 (iv) a plurality of source lines, the source of each said transistor in a column of said memory cells being connected to a source line corresponding to said column;

(b) a row address decoder having a plurality of output lines, individual of said output lines being connected to a corresponding of said word lines, comprising
 (i) means for directing an erase voltage to a selected output line while simultaneously maintaining unselected output lines at zero potential;
 (ii) means for maintaining a selected output line at zero potential and simultaneously directing an inhibit voltage which is less than said erase voltage to unselected output lines; and
 (iii) means for applying a read voltage to a selected output line and simultaneously maintaining unselected output lines at zero potential;

(c) a column address decoder having a plurality of output lines, individual of said output lines being connected to a corresponding of said bit lines, comprising
 (i) means for maintaining all of said bit lines at zero potential;
 (ii) means for applying a write voltage to selected of said bit lines and simultaneously maintaining unselected bit lines at zero potential; and
 (iii) means for applying a small potential to selected of said bit lines and simultaneously maintaining unselected bit lines at zero potential; and (d) an input/output buffer connected to said memory array for determining whether selected of said memory cells of said array are conducting or nonconducting.

12. An electrically erasable programmable read-only memory according to claim 11 wherein said row address decoder is a dynamic decoder.

13. An electrically erasable programmable read-only memory according to claim 11 wherein said row address decoder is a static decoder.

14. An electrically erasable programmable read-only memory according to claim 11 wherein each of said memory cells consists of a single floating gate field effect transistor.

15. An electrically erasable programmable read-only memory comprising:
(a) a memory array comprising:
(i) a matrix of memory cells formed as a plurality of rows and a plurality of columns of said cells, each of said cells consisting of a single n-type floating gate field effect transistor;
(ii) a plurality of word lines, the control gate of each said transistor in a row of said transistors being connected to a word line corresponding to said row;
(iii) a plurality of bit lines, the drain of each said transistor in a column of said transistors being connected to a bit line corresponding to said column; and
(iv) a plurality of source lines, the source of each said transistor in a column of said memory cells being connected to a source line corresponding to said column;
(b) means for applying a first positive voltage to a selected word line and, simultaneously, maintaining unselected word lines as well as all bit lines and all source lines at zero potential such that the floating gate of each said transistor connected to said selected word line is charged to a high threshold voltage;
(c) means for maintaining a selected word line at zero potential and, simultaneously, applying a second positive voltage which is less than said first positive voltage to unselected word lines, applying a third positive voltage to selected of said bit lines and maintaining unselected bit lines at zero potential such that the floating gate of each said transistor having its drain connected to said selected of said bit lines discharges to a low threshold voltage;
(d) means for applying a fourth positive voltage to a selected word line, said fourth voltage being greater than said low threshold voltage and less than said high threshold voltage, and, simultaneously, maintaining unselected word lines at zero potential, applying a small positive potential to selected of said bit lines and maintaining unselected bit lines at zero potential such that a said transistor connected to said selected of said bit lines and having a charged floating gate is nonconducting and a said transistor connected to said selected of said bit lines and having a discharged floating gate is conducting; and
(e) means for monitoring whether selected of said transistors in said matrix is conducting or nonconducting.

16. An electrically erasable programmable read-only memory according to claim 15 wherein said first positive voltage is about +18.0 volts.

17. An electrically erasable programmably read-only memory according to claim 16 wherein said second positive voltage is about +12.0 volts.

18. An electrically erasable programmable read-only memory according to claim 17 wherein said third positive voltage is about +12.0 volts.

19. An electrically erasable programmable read-only memory according to claim 18 wherein said fourth positive voltage is about +4.0 volts.

20. An electrically erasable programmable read-only memory according to claim 19 wherein said small positive potential is about +2.0 volts.

21. A method for encoding binary data into an electrically erasable programmable read-only memory said memory comprising a matrix of memory cells formed as a plurality of rows and a plurality of columns of said cells, each of said cells utilizing a floating gate field effect transistor for storage of binary data, a plurality of word lines, the control gate of each said transistor in a row of said memory cells being connected to a word line corresponding to said row, a plurality of bit lines, the drain of each said transistor in a column of said memory cells being connected to a bit line corresponding to said column, and a plurality of source lines, the source of each said transistor in a column of said memory cells being connected to a source line corresponding to said column, the method comprising:
(a) applying an erase voltage to a selected word line and, simultaneously, maintaining unselected word lines as well as all bit lines and all source lines at zero potential such that the floating gate of each said transistor connected to said selected word line is charged to a high threshold voltage; and,
(b) maintaning a selected word line at zero potential and, simultaneously, applying an inhibit voltage which is less than said erase voltage to unselected word lines, applying a write voltage to selected of said bit lines and maintaining unselected bit lines at zero potential such that the floating gate of each transistor having its drain connected to said selected of said bit lines discharges to a low threshold voltage.

22. A method according to claim 21 including the following further steps for reading binary data from said electrically erasable programmable read-only memory, the further steps comprising:
(a) applying a read voltage to a selected word line, said read voltage being greater than said low threshold voltage and less than said high threshold voltage, and, simultaneously, maintaining unselected word lines at zero potential, applying a small potential to selected of said bit lines and maintaining unselected bit lines at zero potential such that a said transistor connected to said selected of said bit lines and having a charged floating gate is nonconducting and a said transistor connected to said selected of said bit lines and having a discharged floating gate is conducting; and
(b) monitoring whether selected of said transistors is conducting or nonconducting.

23. A method according to claim 21 wherein each of said memory cells consists of a single floating gate field effect transistor.

24. A method according to claim 22 wherein each of said memory cells consists of a single n-type floating gate field effect transistor.

25. A method according to claim 24 wherein said erase voltage is about +18.0 volts.

26. A method according to claim 25 wherein said inhibit voltage is about +12.0 volts.

27. A method according to claim 26 wherein said write voltage is about +12.0 volts.

28. A method according to claim 27 wherein said small potential is about +2.0 volts.

29. A method according to claim 22 wherein each of said memory cells consists of a composite floating gate field effect transistor, said composite transistor comprising:
- (a) first and second semiconductor regions of a first conductivity type, said first and second regions being physically separated by a third semiconductor region of a second conductivity type, a selected of said bit lines and a selected of said source lines being connected to said first and second regions, respectively;
- (b) a first electrically conducting layer overlying said third region and at least a portion of said second region and separated from said first, second and third regions by an electrically insulating material, a portion of said insulating material between said first conducting layer and said second region being about 200 Angstroms or less thick; and
- (c) a second electrically conducting layer overlying said first conducting layer and also overlying the entire of said third region, said second conducting layer being separated from said first conducting layer and from said first, second and third regions by said insulating material.

30. A method according to claim 29 wherein said insulating material is silicon dioxide.

31. A method according to claim 30 wherein said first electrically conducting layer is a refractory metal.

32. A method according to claim 31 wherein said refractory metal is molybdenum.

33. A method for maintaining a floating gate field effect transistor in the enhancement mode, comprising the steps of:
- (a) discharging said floating gate of said transistor by a predetermined amount to reduce the threshold voltage of said transistor;
- (b) comparing said reduced threshold voltage with a desired minimum threshold voltage;
- (c) if said reduced threshold voltage is less than said desired threshold voltage, maintaining said reduced voltage; or
- (d) if said reduced threshold voltage is greater than said desired threshold voltage, repeating the above steps.

34. A method according to claim 33 wherein said predetermined amount is about 0.5 volts.

* * * * *